(12) United States Patent
Lee et al.

(10) Patent No.: US 10,389,315 B2
(45) Date of Patent: Aug. 20, 2019

(54) THREE-INPUT CONTINUOUS-TIME AMPLIFIER AND EQUALIZER FOR MULTI-LEVEL SIGNALING

(71) Applicant: QUALCOMM Incorporated, San Diego, CA (US)

(72) Inventors: Chulkyu Lee, San Diego, CA (US); Shih-Wei Chou, San Diego, CA (US); Ying Duan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/912,170

(22) Filed: Mar. 5, 2018

(65) Prior Publication Data

US 2018/0358939 A1     Dec. 13, 2018

Related U.S. Application Data

(60) Provisional application No. 62/517,760, filed on Jun. 9, 2017, provisional application No. 62/517,782, filed on Jun. 9, 2017.

(51) Int. Cl.
| | |
|---|---|
| *H03F 3/217* | (2006.01) |
| *H03F 1/02* | (2006.01) |
| *H03F 3/68* | (2006.01) |
| *H03F 3/45* | (2006.01) |
| *H03F 3/21* | (2006.01) |
| *H04B 1/06* | (2006.01) |

(52) U.S. Cl.
CPC ......... *H03F 3/2178* (2013.01); *H03F 1/0244* (2013.01); *H03F 1/0277* (2013.01); *H03F 3/211* (2013.01); *H03F 3/45197* (2013.01); *H04B 1/06* (2013.01)

(58) Field of Classification Search
USPC .............................. 330/295, 124 R, 251, 304
See application file for complete search history.

(56) References Cited

U.S. PATENT DOCUMENTS

| 5,881,121 A | 3/1999 | Mann |
|---|---|---|
| 6,346,832 B1 | 2/2002 | Young |

(Continued)

FOREIGN PATENT DOCUMENTS

| CN | 104660227 B | 4/2017 |
|---|---|---|
| WO | WO-2017026096 A1 | 2/2017 |

OTHER PUBLICATIONS

International Search Report and Written Opinion—PCT/US2018/032151—ISA/EPO—dated Aug. 1, 2018.

*Primary Examiner* — Hieu P Nguyen
(74) *Attorney, Agent, or Firm* — Haynes and Boone, LLP

(57) ABSTRACT

A receiver amplifier and also a receiver equalizer is provided for a three-level signaling system. The receiver amplifier includes a single current source that drives a current into node shared by three transistors arranged in parallel. A trio of input signals corresponds to the three transistors on a one-to-one basis. Each input signal drives the gate of its corresponding transistor. In addition, each transistor produces a corresponding output voltage at a terminal coupled to a resistor. The receiver equalizer includes three transistors and three corresponding equalizing pairs of a resistor and a capacitor. A terminal for the capacitor and for the resistor in each equalizing pair connects to a terminal of the corresponding transistor.

13 Claims, 7 Drawing Sheets

(56) References Cited

U.S. PATENT DOCUMENTS

| | | |
|---|---|---|
| 7,403,069 B2 | 7/2008 | D'Aquino |
| 7,414,468 B2 | 8/2008 | Yamaji et al. |
| 8,022,769 B2 * | 9/2011 | Ng .................... H03F 1/086 |
| | | 330/295 |
| 9,202,535 B2 | 12/2015 | Kwon et al. |
| 9,407,221 B2 | 8/2016 | Itakura et al. |
| 9,419,828 B2 | 8/2016 | Walter et al. |
| 9,544,169 B2 | 1/2017 | Zerbe et al. |
| 2004/0150478 A1 | 8/2004 | Richardson |
| 2015/0188523 A1 | 7/2015 | Iguelmamene |
| 2017/0040818 A1 | 2/2017 | Kong et al. |

* cited by examiner

THREE-INPUT CONTINUOUS-TIME AMPLIFIER AND EQUALIZER FOR MULTI-LEVEL SIGNALING

CROSS-REFERENCE TO RELATED APPLICATIONS

This application claims the benefit of U.S. Provisional Application No. 62/517,782, filed Jun. 9, 2017, and also claims the benefit of U.S. Provisional Application No. 62/517,760, filed Jun. 9, 2017.

TECHNICAL FIELD

This application relates to multi-level signaling, and more particularly to a three-input continuous-time amplifier and equalizer for multi-level signaling.

BACKGROUND

Slow-speed transmission of multi-bit words typically occurs over multi-wire buses. For example, an eight-bit word may be transmitted over a bus having eight wires, one for each bit. But in such conventional busses, each bit propagates independently of the remaining bits. As the data rates increase, such parallel data transmission becomes problematic in that the various bits in a word become skewed from each other as the word propagates over the bus.

Given the issues with skew between multiple bits in high-speed communication, various serializer/deserializer (SerDes) systems have been developed. A SerDes transmitter serializes a multi-bit word into a serial stream of corresponding bits for transmission to a receiver. There can then be no such skew between adjacent bits as occurs in parallel transmission since a single transmission line (which may be differential) is used for the serial data stream. The SerDes receiver deserializes the received serial bit stream into the original word. However, the transmission line and the receiver load introduce distortion into the serial data stream as the data transmission rate exceeds, for example, 10 GHz. Adjacent bits in the serial data stream then begin to interfere with each other. Complicated equalizing schemes become necessary to fight the resulting inter-symbol interference and thus it becomes difficult to push SerDes data transmission rates even higher.

To increase data transmission rates over the SerDes limitations, a three-level signaling protocol has been developed in which three transmitters drive three separate transmission lines. The three transmitters may be either voltage-mode or current-mode transmitters. Since the net current must be zero, all three transmitters cannot be active (either transmitting or receiving current) in a three-level signaling system. Similarly, there must be current injected and received so all three transmitters cannot be inactive for any given symbol. So that means that two of the three transmitters will be active for each symbol, with one sourcing current and the other receiving current. From a set of three transmitters, there are three distinct pairs of transmitters that can be active. Within each pair, there are two possibilities depending upon which transmitter is sourcing versus which transmitter is receiving. There are thus six distinct combinations of two active transmitters each sourcing or receiving a given amount of current in a three-transmitter multi-level system. Each distinct combination of active transmitters may be denoted as a symbol. Since there are six possible symbols, each transmitted symbol represents 2.5 bits. In this fashion, data transmission speeds may be more than doubled over binary transmission at the same symbol rate using a single channel, albeit at the cost of increased power consumption.

The three transmitted signals may be designated as signals A, B, and C, respectively. The binary values of these signals depend upon a number of factors such as the power supply voltage and the termination resistances. In the following examples, the binary high voltage is assumed to be 300 mV whereas the binary low voltage is assumed to be 100 mV. The remaining signal voltage will be approximately one-half of the binary high voltage (in this example, 200 mV). However, it will be appreciated that these voltage values are merely exemplary and may be varied in alternative implementations. It is conventional to receive the three transmitted signals using three high-speed receiver equalizers. However, the amplitudes of the received signals may be too low for equalization to proceed efficiently due to propagation losses. It is thus also conventional to boost the amplitude of the received signals prior to equalization. The three received signals prior to amplification may be designated as signals A, B, and C. Received signal A would thus be amplified to form into an amplified (which may also be designated as level-shifted) signal AO. Similarly, received signal B would be amplified to form an amplified signal BO, and received signal C would be amplified to form an amplified signal CO.

It is conventional to perform the amplification using three high-speed receiver amplifiers as shown in FIG. 1A. A first receiver amplifier 100 includes a differential pair of PMOS transistors P1 and P2. The received signal A drives the gate of transistor P1 whereas received signal B drives the gate of transistor P2. The drains of transistors P1 and P2 couple to ground through respective resistors R. The drain of transistor P1 drives an output signal AO. Similarly, the drain of transistor P2 drives an output signal BO. A current source of I drives the sources of transistors P1 and P2.

A second receiver amplifier 105 is analogous to receiver 100 in that it includes a differential pair of PMOS transistors P3 and P4. Received signal B drives the gate of transistor P3 whereas a received signal C drives the gate of transistor P4. Resistors R and a current source providing a current I are arranged as discussed with regard to receiver amplifier 100. The drain of transistor P3 drives output signal BO. Similarly, the drain of transistor P4 drives an output signal CO.

A third receiver 110 is also analogous to receiver 100 in that it includes a differential pair of PMOS transistors P5 and P6. Received signal C drives the gate of transistor P5 whereas received signal A drives the gate of transistor P6. Resistors R and a current source providing a current I are arranged as discussed with regard to receiver amplifier 100. The drain of transistor P5 drives output signal CO. Similarly, the drain of transistor P6 drives output signal AO.

The three resulting receiver amplifiers 100, 105, and 110 thus consume 3*I total current. Such current consumption is exacerbated as additional channels are used (each channel corresponding to its own trio of signals A, B, and C). Moreover, inevitable mismatches between the differential pair transistors exacerbate the bit error rate. In addition, the use of three differential receiver amplifiers for each trio of signals demands significant die space. Accordingly, there is a need in the art for receiver amplifiers with increased density, reduced power consumption, and reduced layout mismatch for multi-level signaling systems.

The amplified signals AO, BO, and CO may then be equalized in receiver equalizers such as shown in FIG. 1B. A first receiver equalizer 115 includes a differential pair of PMOS transistors P7 and P9. Amplified signal AO drives the gate of transistor P7 whereas amplified signal BO drives the gate of transistor P8. The drains of transistors P7 and P8 couple to ground through respective resistors $R_0$. The drain of transistor P7 drives an output signal AO'. Similarly, the drain of transistor P8 drives an output signal BO'. A current source of a current I drives the source of transistor P7. Similarly, another current source of current I drives the source of transistor P8. To accentuate the high-frequency gain, the common source for transistors P7 and P8 is degenerated by a capacitor Cs that couples in parallel with a resistor Rs between the sources of transistors P7 and P8.

A second receiver equalizer 120 is analogous to receiver equalizer 115 in that it includes a differential pair of PMOS transistors P9 and P10. Amplified signal BO drives the gate of transistor P9 whereas amplified signal CO drives the gate of transistor P10. Resistors $R_0$, capacitor Cs, resistor Rs, and the pair of current sources each providing a current I are arranged as discussed with regard to receiver equalizer 115. The drain of transistor P9 drives output signal BO'. Similarly, the drain of transistor P10 drives an output signal CO'.

A third receiver equalizer 125 is also analogous to receiver equalizer 115 in that it includes a differential pair of PMOS transistors P11 and P12. Amplified signal CO drives the gate of transistor P11 whereas amplified signal AO drives the gate of transistor P12. Resistors $R_0$, capacitor Cs, resistor Rs, and the pair of current sources each providing a current I are arranged as discussed with regard to receiver equalizer 115. The drain of transistor P11 drives output signal CO'. Similarly, the drain of transistor P12 drives output signal AO'.

The three resulting receiver equalizers 115, 120, and 125 thus consume 6*I total current. Such current consumption is exacerbated as additional channels are used (each channel corresponding to its own trio of signals A, B, and C). Moreover, inevitable mismatches between the differential pair transistors exacerbate the bit error rate. In addition, the use of three receiver equalizers for each trio of signals demands significant die space. Accordingly, there is a need in the art for equalizers with increased density, reduced power consumption, and reduced layout mismatch for multi-level signaling systems.

SUMMARY

A receiver amplifier is provided for a three-level signaling system. The receiver amplifier includes three matched transistors. The following discussion will assume that the three transistors are PMOS transistors but it will be appreciated that an equivalent receiver may be constructed using NMOS transistors in alternative implementations as described further below. A current source drives the sources of the three transistors. The three transistors correspond on a one-to-one basis with the trio of received signals such that each received signal drives the gate of the corresponding transistor. A trio of resistors also corresponds on a one-to-one basis with the transistors such that a drain for each transistor connects to ground (for a PMOS implementation) through the corresponding resistor.

The drain of each transistor in the receiver amplifier produces a corresponding output signal. It can be shown that the receiver amplifier produces the same output voltage swings in the three output signals as produced by conventional receiver amplifiers 100, 105, and 110 discussed earlier if the current source supplies 1.5 times the current I. The receiver amplifier thus uses only just one half the conventional current consumption of 3*I. In addition, just one half the number of transistors and resistors are used in the disclosed receiver amplifier as compared to conventional approaches such that density is enhanced. Moreover, the reduction in the number of devices for the receiver amplifier also reduces the adverse effects from layout mismatch.

A three-input equalizer is provided for equalizing the amplified received signals is also disclosed for a three-level signaling system. In alternative implementations, the received signals may be equalized without any previous amplification. The equalizer includes three matched transistors. The following discussion will assume that the three transistors are PMOS transistors but it will be appreciated that an equivalent receiver may be constructed using NMOS transistors in alternative implementations. Three current sources drive the sources of the three transistors on a one-to-one basis. In addition, the three transistors correspond on a one-to-one basis with the trio of amplified signals such that each amplified signal drives the gate of the corresponding transistor. A trio of resistors also corresponds on a one-to-one basis with the transistors such that a drain for each transistor connects to ground (for a PMOS implementation) through the corresponding resistor.

The drain of each transistor produces a corresponding output signal. Given this core structure, the equalization may be performed in at least two alternative implementations. In a first implementation, three parallel combinations of an equalizing capacitor and a resistor correspond to the three possible transistor pairings for the three transistors. Each parallel combination of an equalizing capacitor and resistor is referred to herein as an "equalizing pair." In particular, a first equalizing pair is connected in parallel between the source of a first one of the three transistors and a source of a second one of the three transistors. Similarly, a second equalizing pair is connected in parallel between the source of the second transistor and a source for a remaining third one of the transistors. Finally, a third equalizing pair is connected between the source of the first transistor and the source of the third transistor. It can be shown that the equalizer of the first implementation produces the same output voltage swings and same equalization gain for the three output signals as produced by separate conventional equalizers 115, 120, and 125 discussed earlier if each current source supplies the same current I, each equalizing capacitor is 1/1.5 times the Cs capacitance, and each equalizing resistor has 1.5 times the Rs resistance.

In a second equalizer implementation, a first terminal for the three equalizing pairs are connected to the sources of the three transistors on a one-to-one basis. A remaining terminal for each of the three equalizing pairs connects to a common node. It can be shown that the equalizer of the second implementation produces the same output voltage swings and same equalization gain for the three output signals as produced by separate conventional equalizers 115, 120, and 125 discussed earlier if each current source supplies the same current I, each equalizing capacitor is two times the Cs capacitance, and each equalizing resistor has one-half the Rs resistance.

The disclosed equalizers thus each use just one half the conventional current consumption of 6*I. In addition, each disclosed equalizer uses just one half the number of transistors as compared to the conventional approach such that density is enhanced. Moreover, the reduction in the number of devices for the disclosed equalizers also reduces the adverse effects from layout mismatch. These advantageous features may be better appreciated through a consideration of the following example implementations.

DETAILED DESCRIPTION

A receiver amplifier for a three-level signaling system is disclosed herein as well as a receiver equalizer for equalizing the amplified signals amplified by the receiver amplifier. It will be appreciated that the use of the receiver amplifier is optional in that in some implementations, the received signals may be of sufficient amplitude such that the receiver equalizer may proceed to equalize the received signals without any previous amplification. The receiver amplifier will be described first followed by a description of the receiver equalizer. As used herein, the term "three-level signaling" denotes the transmission of three signals in which only one of the three signals has a binary high voltage (e.g., some fraction of a power supply voltage VDD such as 300 mV) and in which another one of three signals is binary low (e.g., 100 mV). A remaining one of the three signals is transmitted at a midrange voltage that is greater than the binary low voltage and less than the binary high voltage. It is convenient for the midrange voltage to equal one-half of the binary high voltage but it will be understood that the midrange voltage merely needs to be sufficiently higher than the binary low voltage and sufficiently lower than the binary high voltage so as to be reliably distinguishable. As known in the three-level signaling arts, at least two of the signals must change state with every symbol transmission. For example, a binary high signal could transition to the midrange voltage while a midrange signal transitions to the binary high voltage.

Figure 2:
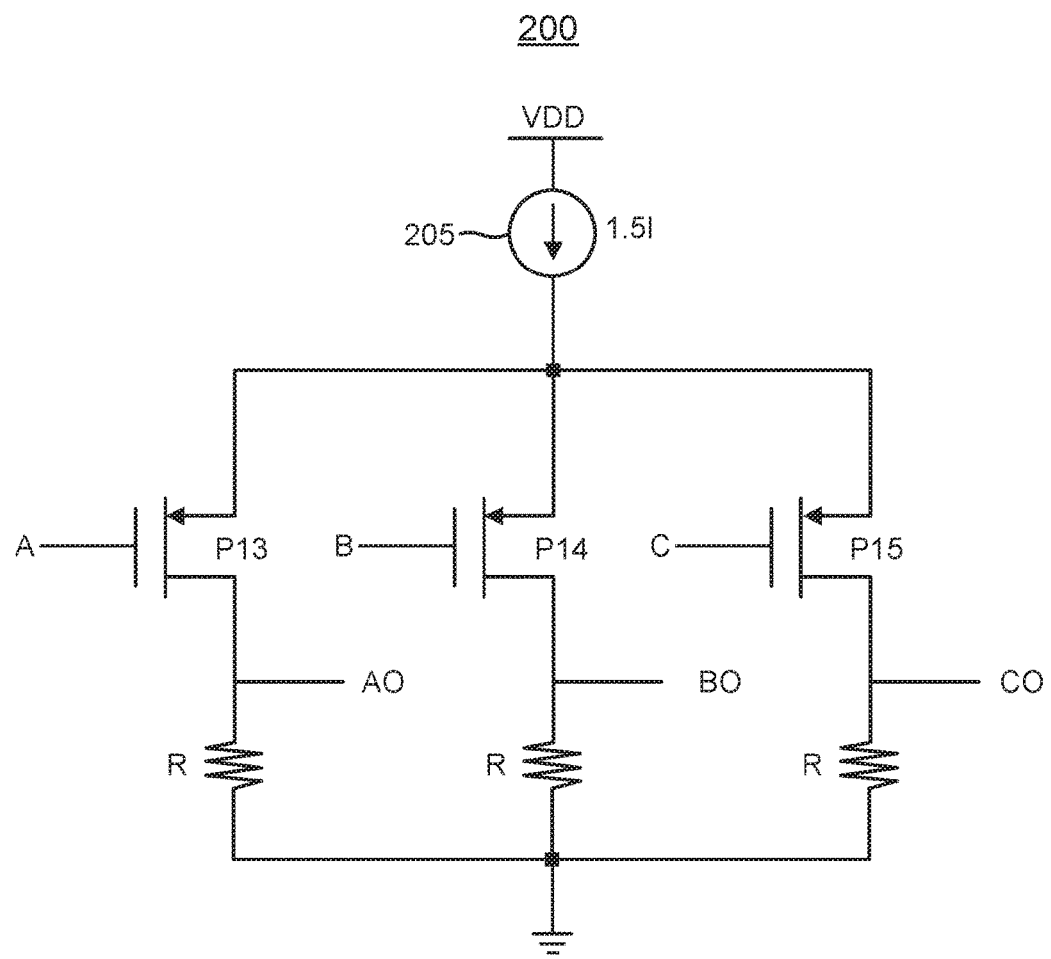
FIG. 2 is a diagram of a receiver amplifier for a three-level signaling system in accordance with an aspect of the disclosure.

An example receiver amplifier 200 for a three-level signaling system is shown in FIG. 2. Each multi-level input signal is received at the gate of a corresponding transistor. The following discussion will be directed to a PMOS implementation but it will be appreciated that an NMOS implementation may be constructed as discussed further below. In receiver amplifier 200, signal A drives the gate of a PMOS transistor P13. Similarly, signal B drives the gate of a PMOS transistor P14. Finally, signal C drives the gate of a PMOS transistor P15. The sources of transistors P13, P14, and P15 couple to the output of a current source 205 that connects between the transistor sources and a power supply node for a power supply voltage VDD. The drain of each these transistors couples to ground through a corresponding resistor R. In addition, the drain of transistor P13 produces the amplified signal AO. Similarly, the drain of transistor P14 produces the amplified signal BO whereas the drain of transistor P14 produces the amplified signal CO.

It can be shown that amplified signals AO, BO, and CO have the same output amplitude swing as produced by conventional receivers 100, 105, and 110 if current source 205 produces 1.5 times the current I produced by the conventional receiver current sources. Since receiver amplifiers 100, 105, and 110 each have a current source of value I, receiver amplifier 200 thus consumes only one-half the current consumed by conventional receiver amplifier architectures (assuming that transistors P13 through P15 are matched to transistors P1 through P6 and resistors R all have the same resistance to provide the same output amplitudes for amplified signals AO, BO, and CO).

Operation of receiver amplifier 200 may be demonstrated by its response to an example three-level signaling in which signal A is a logic one, signal B is logic zero, and signal C is at the mid-range voltage. To save power, it is conventional to generate signals A, B, and C as low-swing signals that do not exceed more than a fraction of the power supply voltage to reduce the power consumption. At such reduced voltages, even a binary high value will not fully shut off the corresponding transistor. In response to the logic one value for signal A, transistor P13 will then be weakly on whereas transistor P14 will be more strongly switched on in response to the logic zero value for signal B. In response to the mid-level voltage for signal C, transistor P15 will be switched on to a degree that lies between the weakly-on state of transistor P13 and the more strongly switched on state of transistor P14. As defined herein, a transistor such as transistor P15 that is switched on to a degree that lies between a weakly-on state and a more strongly-switched on state is designated as being "partially switched on."

The 1.5*I current from current source 205 will thus predominately flow through transistor P14 since it is strongly switched on with a smaller portion flowing through transistor P15 since it is partially switched on and an even smaller portion flowing through transistor P13 since it is weakly switched on. Amplified signal AO would then be nearly grounded while the voltage for amplified signal BO would be greater (e.g., twice as high) as the voltage for amplified signal CO. In a subsequent received symbol, at least two of signals A, B, and C must change state. But regardless of which signal is high, which is low, and which is mid-range, it will readily be appreciated that the desired output signal voltages will have the desired tri-level behavior such that one is high, one is mid-range, and one is low (all depending upon the voltage of the corresponding one of the received signals A, B, and C).

Figure 3:
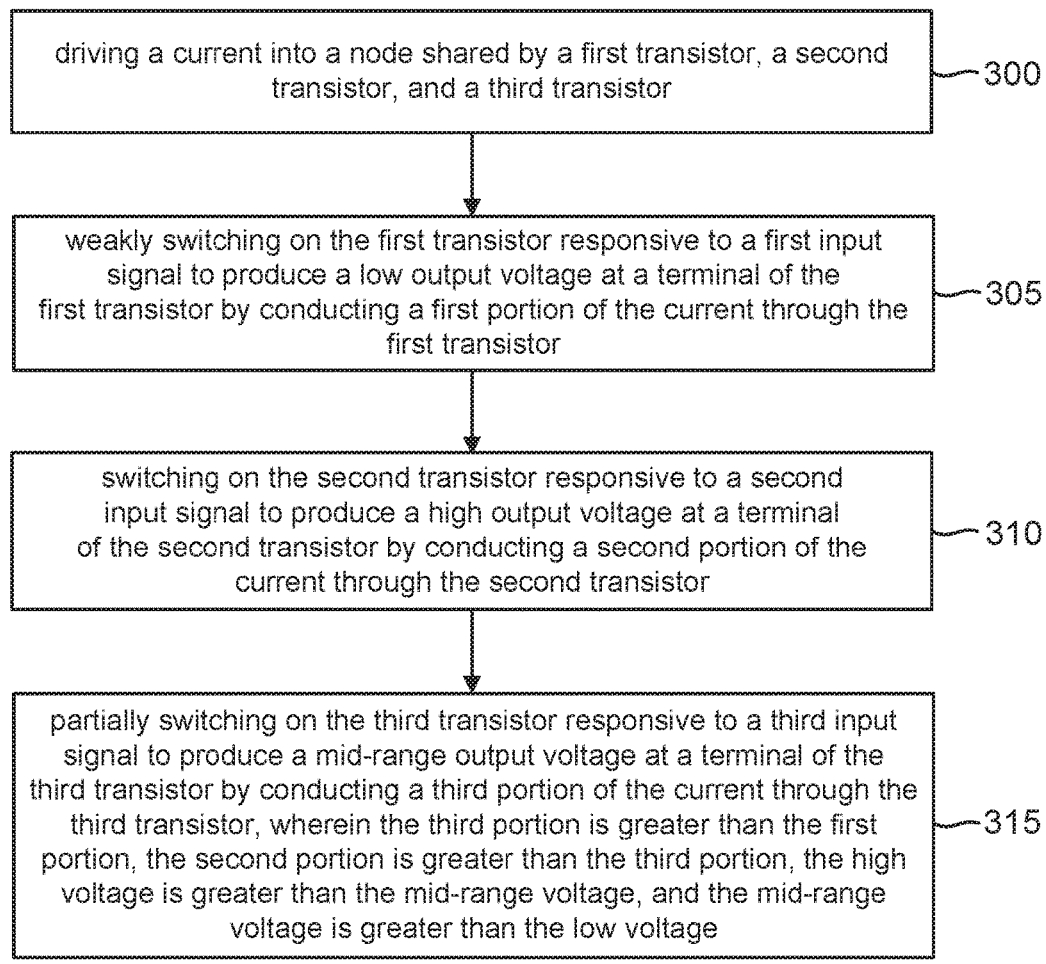
FIG. 3 is a flowchart for an example method of operation for the receiver amplifier in accordance with an aspect of the disclosure.

A method of operation for a receiver amplifier will now be discussed with regard to the flowchart of FIG. 3. The method begins with an act 300 of driving a current into a node shared by a first transistor, a second transistor, and a third transistor. Current source 205 driving the 1.5*I current into the source node for transistors P13, P14, and P15 is an example of act 300. The method also includes acts 305, 310, and 315 that are all performed while the current is driven into the shared node. Act 305 comprises weakly switching on the first transistor responsive to a first input signal to produce a low output voltage at a terminal of the first transistor. Nearly grounding the drain of transistor P13 responsive to input signal A having a binary high value is an example of act 305. In addition, the method includes act 310 of switching on the second transistor responsive to a second input signal to produce a high output voltage at a terminal of the second transistor by conducting a first portion of the current through the second transistor. The switching on of transistor P14 responsive to the binary zero value for input signal B is an example of act 310. Finally, the method includes act 315 of partially switching on the third transistor responsive to a third input signal to produce a mid-range output voltage at a terminal of the third transistor by conducting a third portion of the current through the third transistor, wherein the third portion is greater than the first portion, the second portion is greater than the third portion, the high voltage is greater than the mid-range voltage, and the mid-range voltage is greater than the low voltage. The partial switching on of transistor P15 responsive to the mid-level value for input signal C is an example of act 315.

Figure 4A:
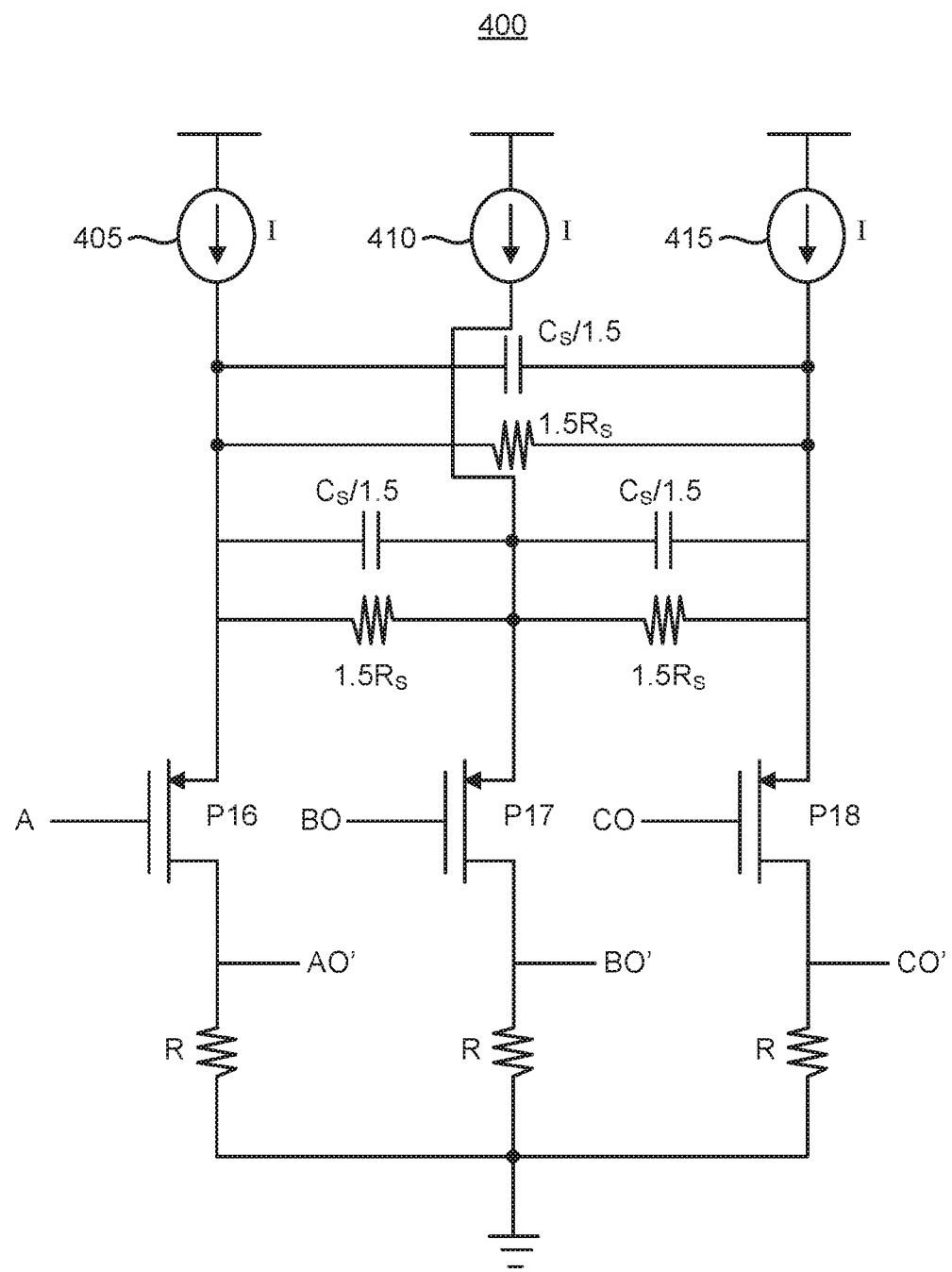
FIG. 4A is a diagram of a receiver equalizer for a three-level signaling system in accordance with an aspect of the disclosure.

An equalizer for equalizing amplified signals AO, BO, and CO will now be discussed. Such equalization may instead be performed on received signals A, B, and C if they are of sufficient amplitude such that amplification is unnecessary in alternative implementations. An example three-input receiver equalizer 200 is shown in FIG. 4A for a first equalizer implementation. Each amplified multi-level signal is received at the gate of a corresponding PMOS transistor (note that an NMOS implementation may be constructed as further discussed below). In receiver equalizer 200, amplified signal AO drives the gate of a transistor P16. Similarly, amplified signal BO drives the gate of a transistor P17. Finally, amplified signal C drives the gate of a transistor P18. A current source 405 drives a current I into a source for transistor P16. A current source 410 for transistor P17 and a current source 415 for transistor P18 are arranged analogously. Each current source 405, 410, and 415 connects between the source of its corresponding transistor and a power rail for providing a power supply voltage VDD. The drain of each transistor couples to ground through a corresponding resistor R. In addition, the drain of transistor P16 produces an output signal AO'. Similarly, the drain of transistor P17 produces an output signal BO' whereas the drain of transistor P18 produces an output signal CO'.

Figure 1A:
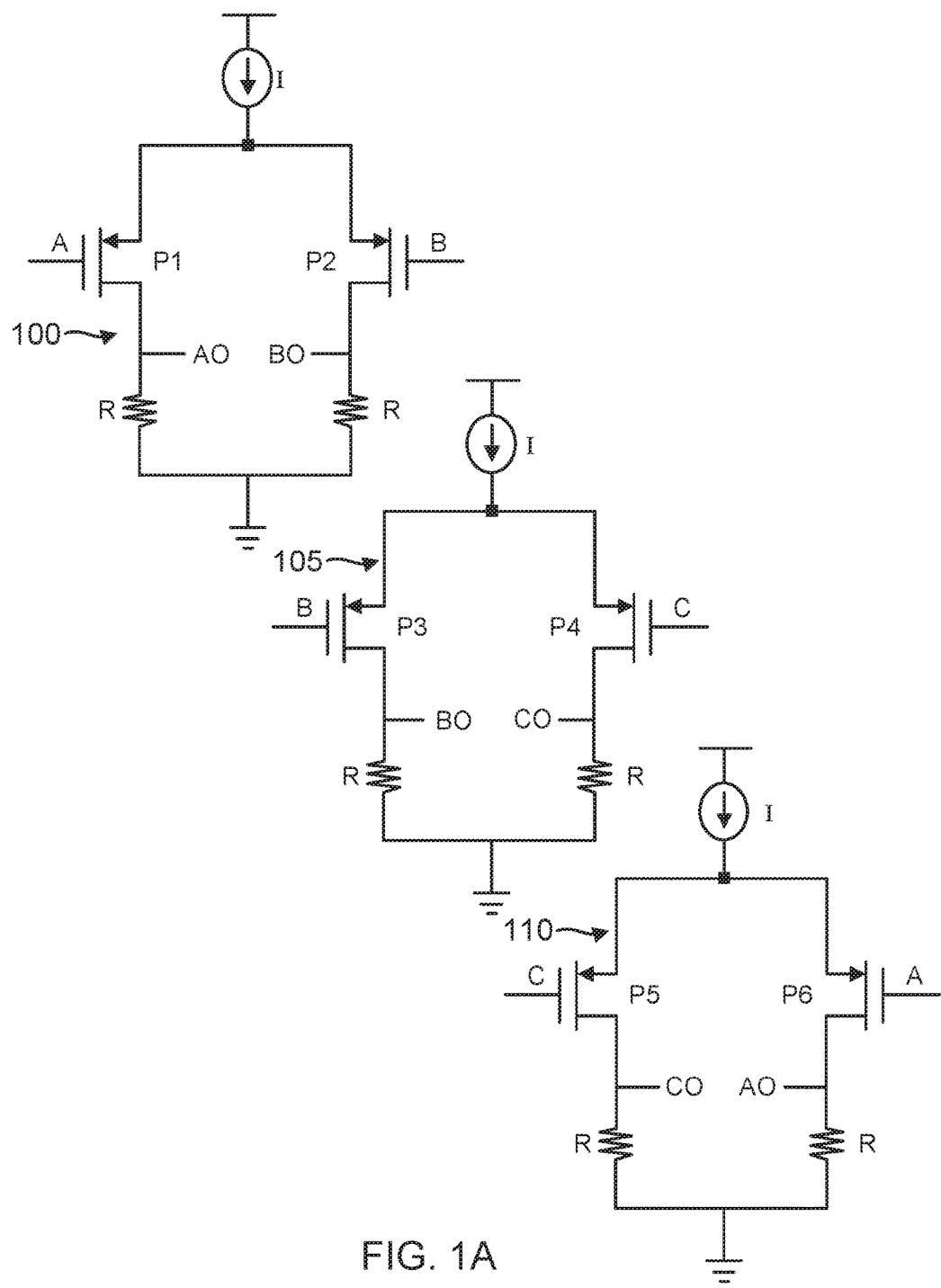
FIG. 1A is a diagram of conventional multi-level receiver amplifiers for a three-level signaling system.
Figure 1B:
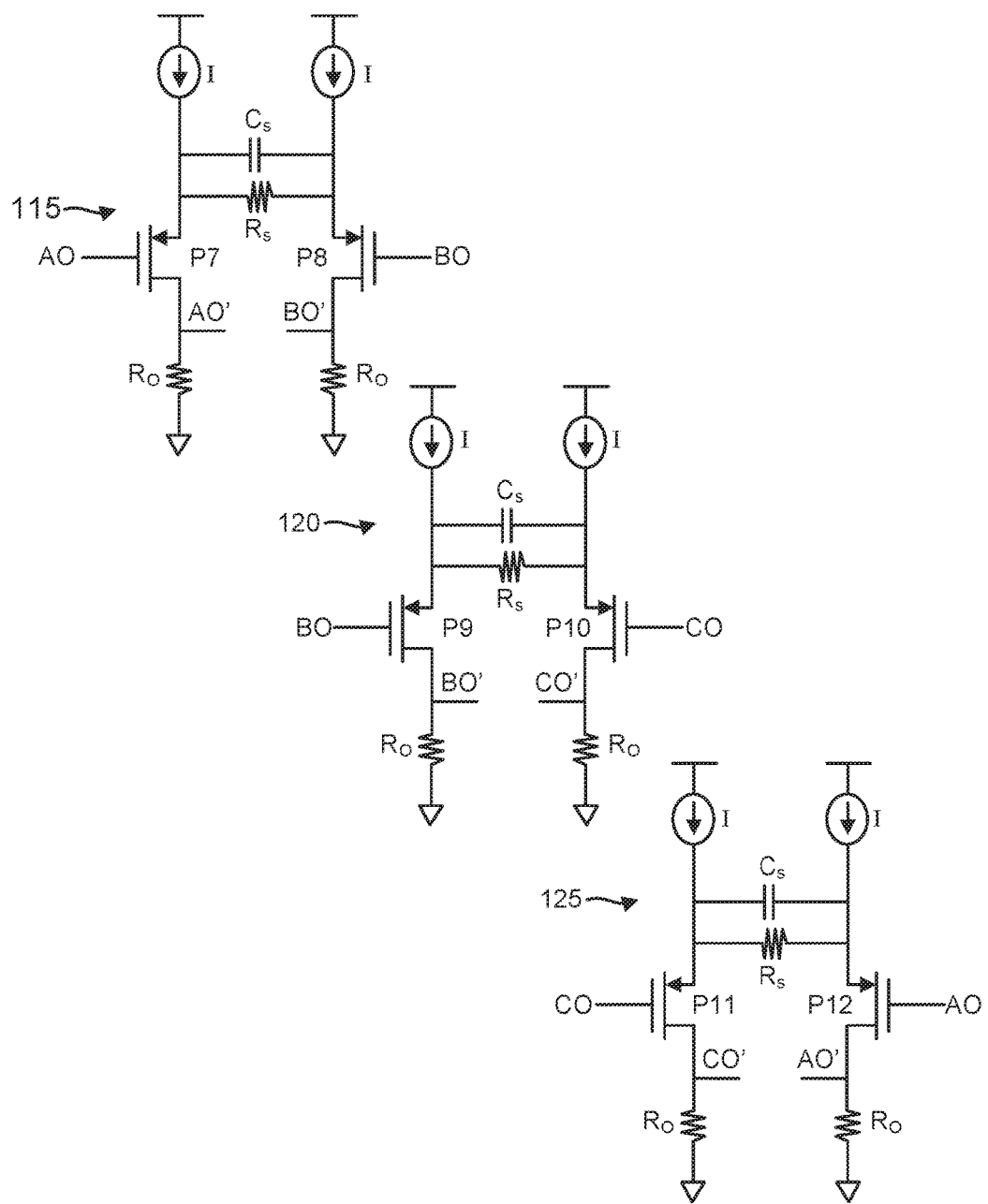
FIG. 1B is a diagram of conventional multi-level receiver equalizers for a three-level signaling system.

An equalizing pair of a capacitor and a resistor is coupled between each pair of transistors from transistors P16, P17, and P18. Since there are three such pairings of the three transistors, there are three equalizing pairs. In particular, a first equalizing pair of a capacitor Cs/1.5 having 1/1.5 the capacitance of capacitor Cs (FIG. 1) and a resistor Rs*1.5 having 1.5 times the resistance Rs connects between the source of transistors P16 and P17. Similarly, another equalizing pair having a capacitor Cs/1.5 and a resistor 1.5*Rs connects between the source of transistors P17 and P18. Finally, another equaling pair having a capacitor Cs/1.5 and a resistor 1.5*Rs connects between the source of transistors P16 and P18.

With the equalizing pair capacitance of Cs/1.5 and the equalizing pair resistance of 1.5*Rs, it can be shown that output signals AO', BO', and CO' have the same output amplitude swing and equalization gain as produced by conventional equalizers 115, 120, and 125 for the same input signal amplitudes, current I, and power supply voltages. Since equalizers 115, 120, and 125 each have two current sources of value I whereas equalizer 400 includes just three such current sources, equalizer 400 thus consumes only one-half the current consumed by the conventional equalizer architectures (assuming that transistors P16 through P18 are matched to transistors P7 through P12 to provide the same output amplitudes for output signals AO', BO', and CO').

An equalizer 450 in accordance with a second equalizer implementation is shown in FIG. 2B. Transistors P16, P17, and P18 and current sources 405, 410, and 415 are arranged as discussed with regard to equalizer 400. There are three equalizing pairs of a capacitor 2Cs and resistor Rs/2. Each capacitor 2Cs has twice the capacitance of the capacitance Cs. Similarly, each resistor Rs/2 has one-half the resistance Rs. Each equalizing pair has a terminal that connects to a common node 455. In particular, a first equalizing pair connects between the source of transistor P16 and common node 455. Similarly, a second equalizing pair connects between the source of transistor P17 and common node 455. Finally, a third equalizing pair connects between the source of transistor P18 and common node 455. It can be shown that equalizer 450 produces the same output swing as equalizers 115, 120, and 125. But like equalizer 400, equalizer 450 consumes just one half the current (3 I instead of 6I).

Figure 5:
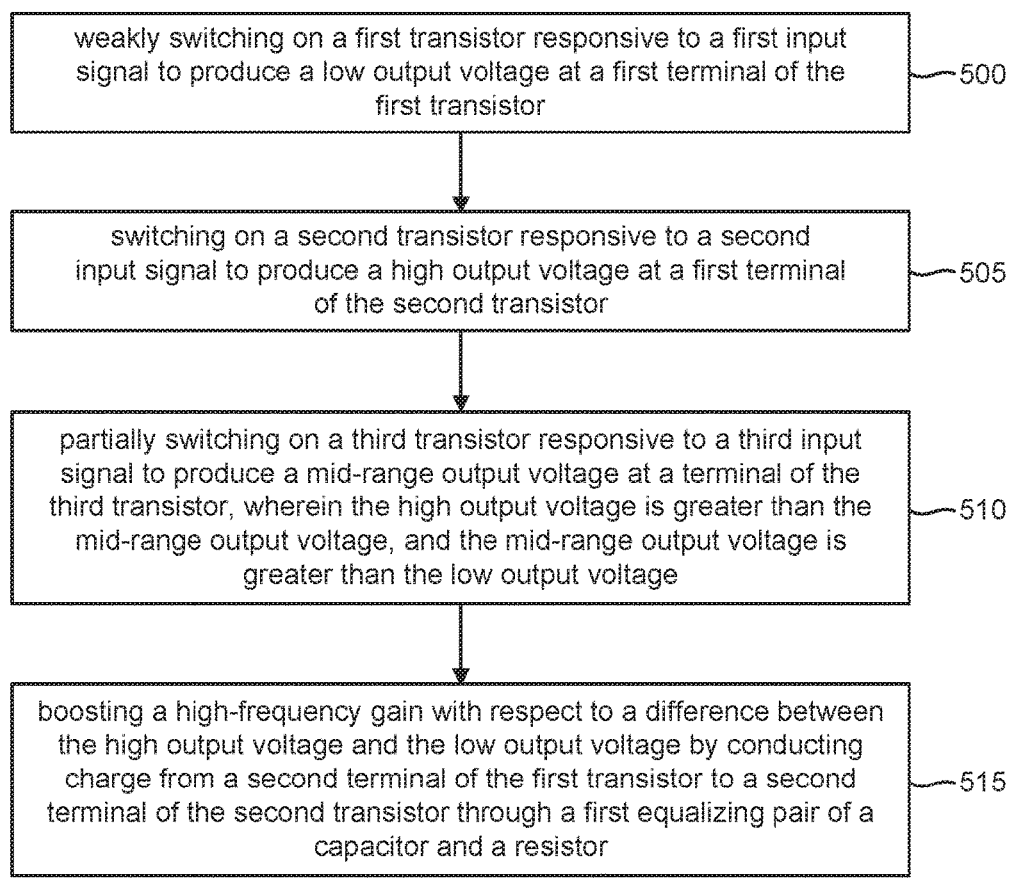
FIG. 5 is a flowchart for an example method of operation for a receiver equalizer in accordance with an aspect of the disclosure.

A method of operation for a receiver equalizer will now be discussed with regard to the flowchart of FIG. 5. The method includes an act 500 of weakly switching on a first transistor responsive to a first input signal to produce a low output voltage at a first terminal of the first transistor. Producing a low output voltage at the drain of transistor P16 in response to amplified signal AO having a binary high value is an example of act 500. In addition, the method includes act 505 of switching on a second transistor responsive to a second input signal to produce a high output voltage at a first terminal of the second transistor. The switching on of transistor P17 responsive to a binary zero value for amplified signal BO is an example of act 505. In addition, the method includes act 510 of partially switching on the third transistor responsive to a third input signal to produce a mid-range output voltage at a terminal of the third transistor wherein the high output voltage is greater than the mid-range voltage, and the mid-range voltage is greater than the low voltage. The partial switching on of transistor P18 responsive to a mid-level value for amplified signal CO is an example of act 510. Finally, the method includes an act 515 of boosting a high-frequency gain with respect to a difference between the high output voltage and the low output voltage by conducting charge from a second terminal of the first transistor to a second terminal of the second transistor through a first equalizing pair of a capacitor and a resistor. The operation of the equalizing pair connected to the source of transistor P16 in either the first implementation (equalizer 400) or the second implementation (equalizer 450) is an example of act 515.

Figure 4B:
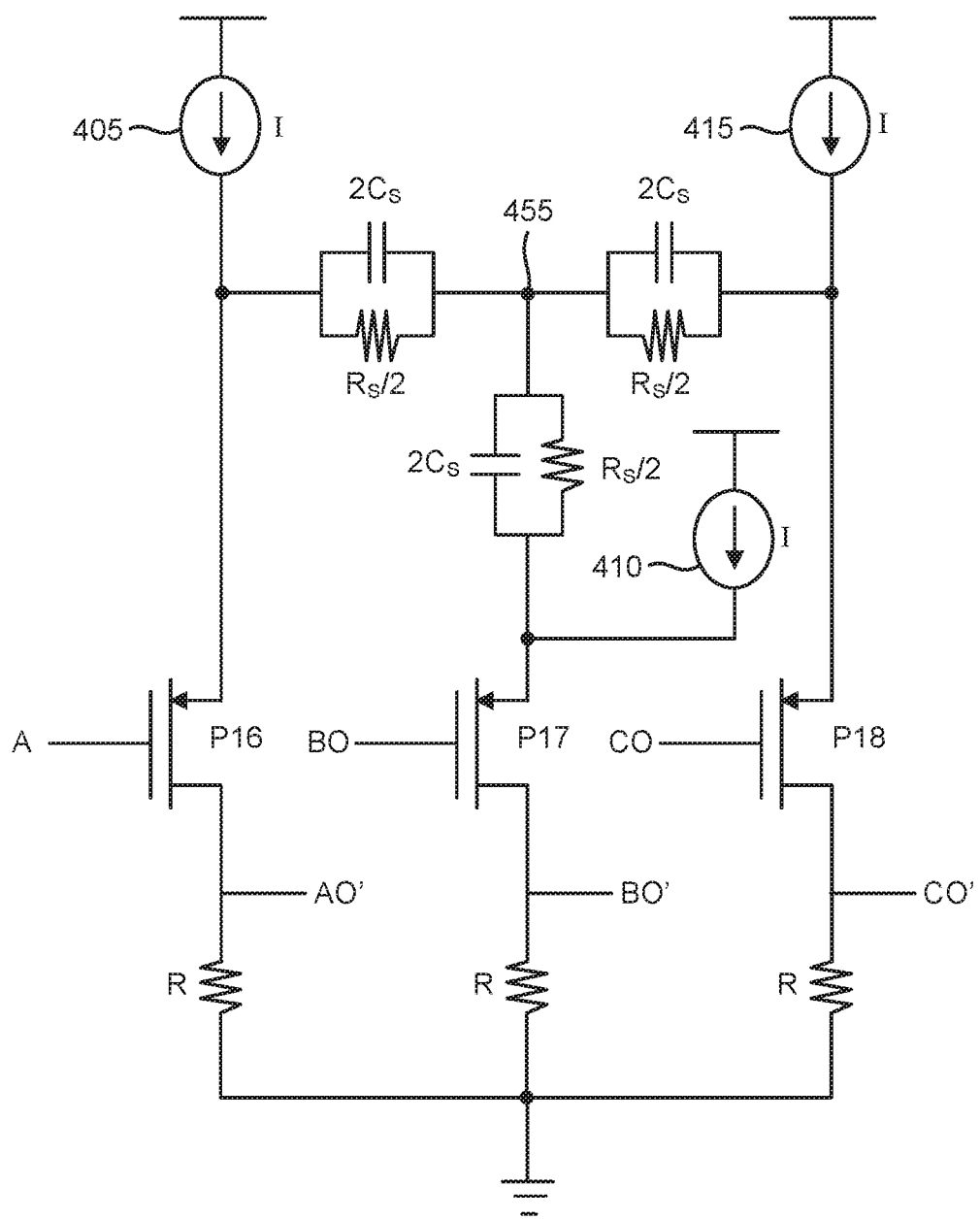
FIG. 4B is a diagram of a receiver equalizer for a three-level signaling system in accordance with an aspect of the disclosure.

Although the transistors in the preceding implementations were all PMOS transistors, it will be appreciated that equivalent NMOS implementations may be constructed. For example, in each of FIGS. 2, 4A, and 4B, the various PMOS transistors may be replaced by NMOS transistors. What is shown as ground in these figures would become the power supply node for an NMOS implementation whereas what is shown as the power supply node would become ground for an NMOS implementation. The current sources for the NMOS implementations would thus be sourcing their currents into ground instead of into the sources of their corresponding transistors. It will thus be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:
1. A receiver equalizer for a three-level signaling system, comprising:
 a first transistor arranged in parallel with a second transistor and with a third transistor, wherein a gate for the first transistor is configured to receive a first signal, a gate for the second transistor is configured to receive a second signal, and a gate for the third transistor is configured to receive a third signal;
a first current source configured to bias a first terminal of the first transistor;
a second current source configured to bias a first terminal of the second transistor;
a third current source configured to bias a first terminal of the third transistor;
a first equalizing pair of a capacitor and a resistor connected to the first terminal of the first transistor;
a second equalizing pair of a capacitor and a resistor connected to the first terminal of the second transistor;
a third equalizing pair of a capacitor and a resistor connected to the first terminal of the third transistor;
a first resistor connected to a second terminal of the first transistor;
a second resistor connected to a second terminal of the second transistor; and
a third resistor coupled between a second terminal of the third transistor.

2. The receiver equalizer of claim 1, wherein the first transistor, the second transistor, and the third transistor are p-type metal oxide semiconductor (PMOS) transistors.

3. The receiver equalizer of claim 1, wherein the first resistor, the second resistor, and the third resistor are all connected to ground.

4. The receiver equalizer of claim 1, wherein the first transistor is matched to the second transistor and to the third transistor.

5. The receiver equalizer of claim 1, wherein the first equalizing pair, the second equalizing pair, and the third equalizing pair are all connected to a common node.

6. The receiver equalizer of claim 1, wherein the first equalizing pair is also connected to the first terminal of the second transistor.

7. The receiver equalizer of claim 6, wherein the second equalizing pair is also connected to the first terminal of the third transistor.

8. The receiver equalizer of claim 7, wherein the third equalizing pair is also connected to the first terminal of the first transistor.

9. A method, comprising:
weakly switching on a first transistor responsive to a first input signal to produce a low output voltage at a first terminal of the first transistor;
switching on a second transistor responsive to a second input signal to produce a high output voltage at a first terminal of the second transistor;
partially switching on a third transistor responsive to a third input signal to produce a mid-range output voltage at a terminal of the third transistor, wherein the high voltage is greater than the mid-range voltage, and the mid-range voltage is greater than the low voltage;
boosting a high-frequency gain with respect to a difference between the high output voltage and the low output voltage by conducting charge from a second terminal of the first transistor to a second terminal of the second transistor through a first equalizing pair of a capacitor and a resistor; and
driving a first current into the second terminal of the first transistor, wherein producing the low output voltage at the first terminal of the first transistor comprises conducting a portion of the first current through a resistor connected to the second terminal of the first transistor.

10. The method of claim 9, further comprising:
boosting a high frequency gain with respect to a difference between the mid-range output voltage and the low output voltage by conducting charge from the second terminal of the first transistor to a second terminal of the third transistor through a second equalizing pair of a capacitor and a resistor.

11. The method of claim 10, further comprising:
boosting a high-frequency gain with respect to a difference between the high output voltage and the mid-range output voltage by conducting charge from the second terminal of the third transistor to the second terminal of the second transistor through a third equalizing pair of a capacitor and a resistor.

12. The method of claim 9, further comprising:
driving a second current into the second terminal of the second transistor; and
driving a third current into the third terminal of the third transistor.

13. The method of claim 9, further comprising:
amplifying a trio of received signals for a three-level signaling system to produce the first signal, the second signal, and the third signal.

* * * * *